(12) United States Patent
Gerhard

(10) Patent No.: US 7,961,298 B2
(45) Date of Patent: *Jun. 14, 2011

(54) POLARIZATION ROTATOR AND A CRYSTALLINE-QUARTZ PLATE FOR USE IN AN OPTICAL IMAGING SYSTEM

(75) Inventor: Michael Gerhard, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 426 days.

This patent is subject to a terminal disclaimer.

(21) Appl. No.: 12/099,533

(22) Filed: Apr. 8, 2008

(65) Prior Publication Data

US 2008/0186469 A1 Aug. 7, 2008

Related U.S. Application Data

(60) Continuation of application No. 11/707,041, filed on Feb. 16, 2007, now abandoned, which is a continuation of application No. 11/336,945, filed on Jan. 23, 2006, now Pat. No. 7,199,864, which is a continuation of application No. 10/883,849, filed on Jul. 6, 2004, now abandoned, which is a division of application No. 10/145,138, filed on May 15, 2002, now Pat. No. 6,774,984.

(30) Foreign Application Priority Data

May 15, 2001 (DE) .................................. 101 24 566

(51) Int. Cl.
*G03B 27/72* (2006.01)
*G03B 27/54* (2006.01)

(52) U.S. Cl. ........................................... 355/71; 355/67

(58) Field of Classification Search .................... 355/52, 355/53, 55, 67–71; 359/494–499, 359
See application file for complete search history.

(56) References Cited

U.S. PATENT DOCUMENTS 3,484,714 A 12/1969 Koester et al.
(Continued)

FOREIGN PATENT DOCUMENTS

DE 195 35 392 A1 3/1997
(Continued)

OTHER PUBLICATIONS

R.W. Wood, Physical Optics, Ch. XVII, "Rotary Polarization", pp. 476-479, 482 and 492-493, The Macmillan Co., New York, 1911.

(Continued)

*Primary Examiner* — Hung Henry Nguyen
(74) *Attorney, Agent, or Firm* — Sughrue Mion, PLLC

(57) ABSTRACT

A polarization rotator and crystalline quartz plate for use with an optical imaging system. The system has several imaging optical components (L1-L16) sequentially arranged along an optical axis (16), a means for creating radially polarized light arranged at a given location in that region extending up to the last of said imaging optical components, and a crystalline-quartz plate employable in such a system. A polarization rotator (14) for rotating the planes of polarization of radially polarized light and transforming same into tangentially polarized light, particularly in the form of a crystalline-quartz plate as noted above, is provided at a given location within a region commencing where those imaging optical components that follow said means for creating radially polarized light in the optical train are arranged. The optical imaging system is particularly advantageous when embodied as a microlithographic projection exposure system.

19 Claims, 1 Drawing Sheet

U.S. PATENT DOCUMENTS

| | | | |
|---|---|---|---|
| 3,719,415 A | 3/1973 | Rawson | |
| 3,915,553 A | 10/1975 | Adams et al. | |
| 4,194,168 A | 3/1980 | Jarrett et al. | |
| 4,755,027 A | 7/1988 | Schafer | |
| 5,300,972 A | 4/1994 | Kamon | |
| 5,365,371 A | 11/1994 | Kamon | |
| 5,442,184 A | 8/1995 | Palmer et al. | |
| 5,459,000 A | 10/1995 | Unno | |
| 5,465,220 A | 11/1995 | Haruki et al. | |
| 5,541,026 A | 7/1996 | Matsumoto | |
| 5,673,103 A | 9/1997 | Inoue et al. | |
| 5,677,755 A | 10/1997 | Oshida et al. | |
| 5,815,247 A | 9/1998 | Poschenrieder et al. | |
| 5,933,219 A | 8/1999 | Unno | |
| 6,163,367 A | 12/2000 | Obszarny | |
| 6,191,880 B1 | 2/2001 | Schuster | |
| 6,219,171 B1 * | 4/2001 | Liao et al. | 359/250 |
| 6,252,712 B1 * | 6/2001 | Furter et al. | 359/499 |
| 6,404,482 B1 | 6/2002 | Shiraishi | |
| 6,466,303 B1 | 10/2002 | Omura et al. | |
| 6,483,573 B1 | 11/2002 | Schuster | |
| 6,636,295 B2 | 10/2003 | Shiozawa | |
| 6,661,499 B2 | 12/2003 | Omura et al. | |
| 6,774,984 B2 * | 8/2004 | Gerhard | 355/71 |
| 6,930,758 B2 * | 8/2005 | Schuster et al. | 355/67 |
| 2001/0019404 A1 | 9/2001 | Schuster et al. | |
| 2004/0057036 A1 | 3/2004 | Kawashima et al. | |

FOREIGN PATENT DOCUMENTS

| | | |
|---|---|---|
| DE | 100 10 131 A1 | 9/2001 |
| EP | 764858 A2 | 3/1997 |

OTHER PUBLICATIONS

Kolchi Matsumoto and Tadao Tsuruta, "Issues and method of designing lenses for optical lithography," Optical Engineering, Dec. 1992, pp. 2657-2664, vol. 31, No. 12.

Yasuyuki Unno, Polarization effect of illumination light, SPIE Optical/Laser Microlithogrpahy VI, 1993, pp. 879-891, vol. 1927.

F.A. Jenkins and H.E. White, Interference of Polarized Light, Fundamentals of Optics, 1973, p. 567.

Gottfried Schroder, Technische Optik, Vogel Buchbverlag, Wuerzburg, 1987 6$^{th}$ Ed., pp. 180-183.

* cited by examiner

POLARIZATION ROTATOR AND A CRYSTALLINE-QUARTZ PLATE FOR USE IN AN OPTICAL IMAGING SYSTEM

This is a continuation of application Ser. No. 11/707,041 filed Feb. 16, 2007, which is a continuation of application Ser. No. 11/336,945 filed Jan. 23, 2006 (now U.S. Pat. No. 7,199,864), which in turn is a continuation of application Ser. No. 10/883,849 filed Jul. 6, 2004, which in turn is a divisional application of application Ser. No. 10/145,138 filed May 15, 2002 (now U.S. Pat. No. 6,774,984). The entire disclosures of the prior applications, application Ser. Nos. 11/707,041, 11/336,945, 10/883,849, and 10/145,138, are considered part of the disclosure of the present continuation application and are hereby incorporated by reference. These Applications claim priority from German Patent Application No. 101 24 566.1, filed on May 15, 2001, which is also incorporated in this application by reference.

FIELD OF AND BACKGROUND OF THE INVENTION

1. Field of the Invention

The invention relates to a polarization rotator and crystalline quartz plate for use with an optical imaging system having several imaging optical components arranged in succession along an optical axis, means for creating radially polarized light arranged within that region extending up to the last of said imaging optical components, and a crystalline-quartz plate employable on such a system.

2. Description of the Related Art

German laid-open publication DE 195 35 392 A1 discloses an optical imaging system of said type in the form of a microlithographic projection exposure system having, e.g., an i-line mercury discharge lamp as a light source. Said system's employment of radially polarized light for exposing wafers was intended to improve the coupling of said light into the layer of photoresist, particularly at very large angles of incidence, while simultaneously achieving maximum suppression of any standing waves that might be caused by reflections at the inner and outer interfaces of said photoresist. Various types of radial polarizers that employ birefringent materials were mentioned as prospective means for creating radially polarized light. That radial polarizer chosen was arranged within that region that followed said system's final phase-correcting or polarizing optical element in the optical train in order that the degree of radial polarization attained prior to incidence on said wafers would remain unchanged. In the event that a catadioptric optical system were employed as said system's projection lens, the radial polarizer involved should be preferably arranged, e.g., following said optical system's final deflecting mirror. Otherwise, it might be arranged, e.g., within the preceding illumination system of the projection exposure system.

Radially polarized light, i.e., light that is linearly polarized parallel to its plane of incidence on an interface, is, in general, preferable in cases involving imaging optics, e.g., the imaging optics of microlithographic projection exposure systems, since radially polarized light allows employing highly effective antireflection coatings on their imaging optical components, particularly their lenses, which is a matter of major importance, particularly in the case of microlithographic projection exposure systems with high numerical apertures and at short wavelengths, e.g., wavelengths falling in the UV spectral range, since there are few coating materials that are suitable for use in that spectral range. On the other hand, tangentially polarized light, i.e., light that is linearly polarized orthogonal to the plane of incidence of an imaging light beam on the respective interfaces of the lenses, or similar, involved, should preferably be employed for illumination in order to allow creating the best possible interference-fringe contrasts when imaging objects on, e.g., wafers. In order to allow same, the older German patent application 100 10 131.3 proposed employing a tangentially polarizing element arranged in the vicinity of a pupillary plane of the projection lens, or within the illumination system that precedes same in the optical train that may be assembled from segmented birefringent plates instead of the radial polarizer of German patent disclosure DE 195 35 392 A1.

OBJECTS OF THE INVENTION

The invention is based on the technical problem of providing a polarization rotator and a crystalline quartz plate for use in an optical imaging system of the type mentioned at the outset that will both allow comparatively highly antireflective coatings on its optics, which will minimize disturbing reflected stray light, and be capable of yielding an exiting light beam that will allow creating high-contrast interference fringes on an image plane.

SUMMARY OF THE INVENTION

According to one formulation, the invention solves these and other objects by providing a polarization rotator and a crystalline quartz plate for use in an optical imaging system, in particular a microlithographic projection exposure system, that includes several imaging optical elements arranged one after the other along an optical axis, and a radial polarizer radially polarizing light transiting said optical imaging system and arranged at a location ahead of the final imaging optical element. The polarization rotator transforms the radially polarized light into tangentially polarized light and is arranged at a location following that imaging optical element that follows said radial polarizer in the optical train. The invention additionally addresses these objects by providing a crystalline-quartz plate configured as a polarization rotator, wherein a crystal axis of said plate is at least approximately normal to the plane of said plate.

The optical imaging system according to the invention is characterized therein that it both provides a means for creating radially polarized light with which at least part of the imaging optical components of said system operate, and provides a polarization rotator for rotating the planes of polarization of said radially polarized light and for transforming same into tangentially polarized light in order to yield light that will be tangentially polarized in an imaging plane. Said polarization rotator is arranged following at least one, and preferably several, or even all, of the imaging optical components of said system.

A consequence of said measures according to the invention is that all imaging optical components of said system that are situated between said means for creating radially polarized light and said polarization rotator may operate with radially polarized light, for which they may be highly effectively antireflection coated. In particular, a conventional type of radial polarizer situated at an arbitrary location in the beam path between said light source, i.e., a location ahead of said system's first imaging optical component, and said system's final imaging optical component, but ahead of said polarization rotator, may serve as said means for creating radially polarized light. Said polarization rotator will simultaneously transform said radially polarized light, which is preferable for the imaging optical components involved, into tangentially polarized light that will then be incident on said image plane, which will allow creating high-contrast interference fringes thereon. Since said polarization transformation is effected by rotating planes of polarization, the associated intensity losses may be held to low levels.

Under another embodiment of the invention, a plate having an optically active material is employed as said polarization rotator. Optically active materials are known to rotate the planes of polarization of transmitted light, where the angles through which same are rotated will be proportional to the thicknesses of said materials and the constants of proportionality involved will increase as the wavelengths involved decrease. Under another embodiment of the invention, a crystalline-quartz plate serves as said polarization rotator. Although said crystalline-quartz plate will also have birefringent properties, suitably dimensioning and orienting said plate will allow maintaining same at levels so low that the desired polarization rotation will not be significantly altered by the optical activity of said crystalline quartz, at least not in cases involving UV-light, e.g., light having wavelengths of about 157 nm or less.

Under beneficial other embodiments of the invention in which said optical imaging system is a microlithographic projection exposure system, said polarization rotator for rotating the planes of polarization of radially polarized light and transforming same into tangentially polarized light is arranged within a section of said system's projection lens where the beam path is approximately parallel to its optical axis, in particular, in a pupillary plane, or within a section lying between a pupillary plane and an image plane of same containing, e.g., a wafer to be illuminated. In the case of the first of said arrangements, arranging said polarization rotator in said pupillary plane has the advantage that the approximately normal incidence of light on said polarization rotator yields a high optical activity of same and the effects of off-axis illumination of same, such as birefringence effects, will remain minimal. On the other hand, arranging said polarization rotator closer to said image plane has the advantages that those imaging optical elements situated between said pupillary plane and said polarization rotator will also be penetrated by radially polarized light and that employment of a smaller polarization rotator will be sufficient.

In the case of the crystalline-quartz plate according to the invention, the crystal axis of said plate is oriented approximately parallel to the normal to its surface. A crystalline-quartz plate having said orientation is particularly well-suited to employment as a polarization rotator on optical imaging systems according to the invention.

Under a modified embodiment of the invention, the thickness of said crystalline-quartz plate is 500 μm or less and preferably about 200 μm or less. Plates that thin are particularly suitable for accomplishing the polarization-rotation function on optical imaging systems according to the invention when operated at far-UV wavelengths of 157 nm or less.

BRIEF DESCRIPTION OF THE DRAWINGS

A beneficial embodiment of the invention is depicted in the accompanying drawings and will be described below. Said drawings depict.

DETAILED DESCRIPTION OF PREFERRED EMBODIMENTS

Figure 1:
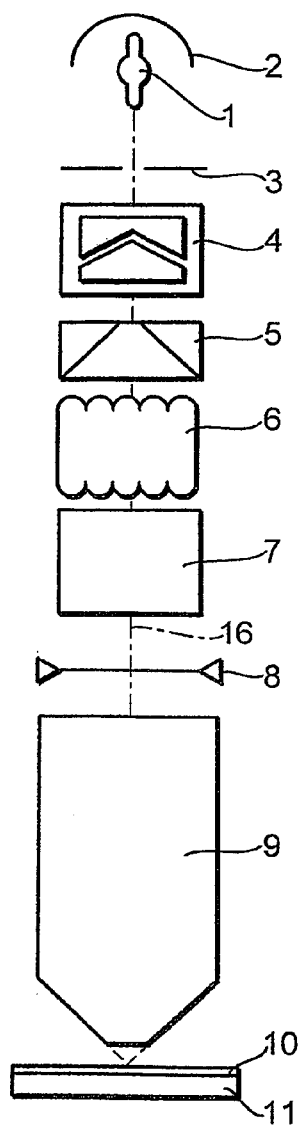
FIG. 1: a schematic drawing of a microlithographic projection exposure system that has a means for creating radially polarized light arranged within its illumination system and a polarization rotator for rotating the planes of polarization of same and for transforming same into tangentially polarized light arranged within its projection lens

FIG. 1 depicts a conventional microlithographic projection exposure system that is similar to that cited in German patent disclosure DE 195 35 392 A1, except for the arrangement of its polarization rotator within its projections lens. Light from a light source (1), e.g., an i-line mercury discharge lamp, that emits illuminating UV-radiation at a desired wavelength focused by a mirror (2) illuminates an aperture stop (3) that is followed by a lens (4) such as, in particular, a zoom lens, and that allows making various adjustments, in particular, choosing a desired circular aperture. Instead of a mercury discharge lamp, a laser light source emitting at a wavelength of around 260 nm or less, e.g., at 157 nm, may be employed as said light source (1), in which case said mirror (2) will be superfluous.

A radial polarizer (5) that transforms unpolarized incident light into radially polarized light is arranged following said lens (4). Said radial polarizer (5) may be, e.g., a truncated-cone polarizer having the configuration described in German patent laid-open publication DE 195 35 392 A1, which performs said transformation without causing significant light losses. The resultant largely radially polarized light then travels from said radial polarizer (5) to a honeycomb condenser (6) and a relay and field lens (7) that follows same in the optical train. The latter components collectively serve to provide optimal illumination of a mask (8), which is also termed a "reticle," bearing the pattern to be imaged. A projection lens (9), which has been configured as a reducing lens and follows said components in the optical train, images said pattern, which lies in the object plane of said projection lens (9), onto a film of photoresist (10) on a wafer (11) lying in the image plane of said projection lens (9) with ultrahigh spatial resolution, preferably with a spatial resolution of better than 1 μm. The numerical aperture of said system should preferably exceed 0.5, in particular, should preferably range from 0.7 to 0.9.

Figure 2:
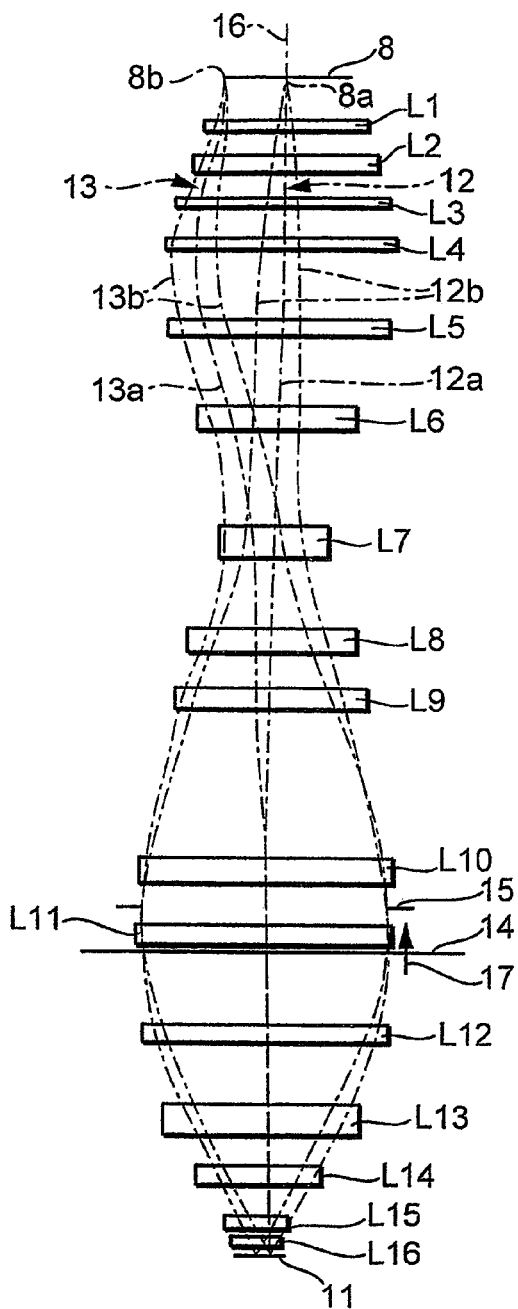
FIG. 2: a detailed drawing of the projection lens depicted in FIG. 1.

FIG. 2 schematically depicts a prospective configuration of said projection lens (9), which has numerous lenses (L1-L16). Since many of the lens arrangements typically employed on projection lenses of that type are known, those lenses (L1-L16) that have been depicted in FIG. 2 are to be interpreted as representing lenses typically employed on said conventional types of lens arrangements and have thus been symbolically indicated by rectangles that, of course, are not intended to represent their true geometric shapes. In order to clarify the operation of said projection lens (9), the paths of the principal rays (12a, 13a) and the marginal rays (12b, 13b) of the imaging beams (12, 13) associated with a central point (8a) of said mask and a point (8b) near the edge of said mask, respectively, have been schematically indicated.

The distinctive feature of the projection lens depicted in FIG. 2 is its arrangement of a polarization rotator (14) that, in the case of this particular example, is situated right after a pupillary plane (15) of said projection lens where a typical aperture stop is arranged. Said polarization rotator (14) has been designed to rotate the planes of polarization of incident radially polarized light and transform same into tangentially polarized light. A thin crystalline-quartz plate whose crystal axis (17), which has been schematically indicated in FIG. 2, is oriented approximately parallel to the optical axis of said projection lens may be employed in an exemplary embodiment of said polarization rotator, where said crystal axis (17) of said crystalline-quartz plate is oriented approximately orthogonal to the plane of said plate, i.e., approximately parallel to the normal to its surface.

Crystalline quartz is known to be optically active and, unlike the case of normal birefringence, rotates the planes of polarization of incident light, regardless of their original orientations, due to its optical activity. Another advantage of optically active materials is that they create no double images. The angle of rotation for a given material will be proportional to its thickness, where the constant of proportionality involved will vary with its temperature and be largely determined by the wavelength involved. In the case of the application involved here, it is particularly beneficial that said constant of proportionality markedly increases with decreasing wavelength and is several times greater for wavelengths falling within the UV spectral range, e.g., the wavelength range 150 nm to 260 nm, than for visible light. This is the reason why it will be sufficient to employ a very thin crystalline-quartz plate whose thickness is only around 500 µm, and preferably 200 µm or less, in order to produce the desired rotation in cases where UV-radiation is employed on microlithographic projection illumination systems. Since birefringence effects will not simultaneously significantly increase at shorter wavelengths, the ratio of the aforesaid desired function of said optical activity to any disturbing birefringence effects will be correspondingly improved at short wavelengths falling within the UV spectral range.

Arranging said polarization rotator (14) near said pupillary plane (15) or at some other location in the beam path where light rays propagate parallel to, or at a small angle of inclination with respect to, said optical axis (16) has the advantage that light rays incident on same will be approximately normal to its surface, in which case the ratio of said desirable function of said optical activity to said, in the case of the example considered here, undesirable, birefringence effects of crystalline quartz, will be particularly large. In the case of that particular location of said polarization rotator (14) shown in FIG. 2, eleven of said sixteen lenses (L1-L16) of said projection lens and the entire optical train of said illumination system, commencing with said radial polarizer (5), will lie within that portion of the beam path where light is largely radially polarized. This will allow providing highly effective antireflection coatings on the lenses involved, while said polarization rotator (14) will provide light incident on said wafer (11) that has the desired, largely tangential, polarization.

Alternatively, said polarization rotator (14) may also be positioned at any arbitrary, location along said optical axis (16) of said system, but should preferably be positioned as close as possible to said image plane or said wafer (11) in order to ensure that as many as possible of said imaging optical components will be penetrated by radially polarized light. Relocating said polarization rotator (14) from the vicinity of said pupillary plane (15) to a location closer to said wafer (11) will allow choosing a smaller diameter for said polarization rotator (14), while providing that at least some of those lenses (L12-L16) situated between the indicated location of said polarization rotator (14) and said wafer (11) will still be irradiated by radially polarized light. However, the divergence, i.e., the maximum angle of inclination with respect to said optical axis (16), of the beam incident on said polarization rotator (14) will then increase.

The ratio of the strength of said optical activity to that of said birefringence effects will decrease with increasing angle of incidence, which will slightly worsen the effects due to said crystalline-quartz material's birefringence. However, decisions regarding the maximum angles of incidence that may be tolerated may be made based on the particular applications to be involved. Those decisions will also depend upon the extent to which light has been radially polarized with respect to the optical axis of the crystal of said polarization rotator (14) prior to its arrival at same, since, in the ideal case of totally radially polarized light, no birefringence effects will occur, even for high beam divergences, i.e., at large angles of incidence on same. However, said ideal case will usually be unachievable in actual practice, since light supplied by said illumination system will not be perfectly radially polarized and slight departures from perfect radial polarization will occur due to stress-induced birefringence in said lenses. Nevertheless, fairly high beam divergences may be tolerated due to the resultant very high degrees of optical activity, particularly at short UV-wavelengths, and said polarization rotator (14) might even be positioned between the last of said lenses (L16) and said wafer (11). The latter placement of said polarization rotator (14) has the particularly beneficial advantage that all imaging optical components of said optical imaging system will be able to operate with radially polarized light and said polarization rotator (14) will no longer need to be incorporated into said projection lens, i.e., may be positioned outside same.

The foregoing description of a beneficial sample embodiment makes it clear that an optical imaging system according to the invention will allow achieving high-quality imaging largely free of the disturbing effects of stray light by providing that a large majority of said imaging optical components, preferably at least ⅔ thereof, will be irradiated by radially polarized light for which said imaging optical components have highly effective antireflection coatings. Said optical imaging system will also be capable of providing a largely tangentially polarized beam that will allow creating high-contrast interference fringes, such as those that will be of benefit when same is employed as, e.g., a microlithographic projection illumination system for exposing photoresists on wafers, at its image plane.

What is claimed is:

1. An optical system comprising:
   a microlithographic projection exposure system comprising a polarization element;
   wherein the polarization element is an optically active polarization element comprising a crystalline quartz plate disposed such that an optical axis of the crystalline quartz plate is substantially parallel to an optical axis of the microlithographic projection exposure system; and
   wherein optical activity of the polarization element outputs light which is substantially tangentially polarized.

2. The optical system of claim 1, wherein a crystal axis of the crystalline quartz plate is substantially normal to a plane of the crystalline quartz plate.

3. The optical system of claim 1, wherein the polarization element rotates a plane of polarization of light passing therethrough by an angle proportional to a thickness of the polarization element.

4. The optical system of claim 1, wherein the microlithographic projection exposure system further comprises a projection lens, and the polarization element is disposed within the projection lens.

5. The optical system of claim 1, wherein the microlithographic projection exposure system further comprises a projection lens, and the polarization element is disposed at a pupillary plane of the projection lens.

6. The optical system of claim 1, wherein the microlithographic projection exposure system further comprises a projection lens, and the polarization element is disposed between a pupillary plane of the projection lens and an image plane of the projection lens.

7. The optical system of claim 6, wherein the polarization element is disposed closer to the image plane of the projection lens than to the pupillary plane of the projection lens.

8. The optical system of claim 7, wherein the polarization element is disposed as close as possible to the image plane of the projection lens.

9. The optical system of claim 1, wherein the polarization element is disposed at a location within the microlithographic projection exposure system where light on the optical beam path propagates substantially parallel to an optical axis of the microlithographic projection exposure system.

10. An optical system comprising:
   a microlithographic projection exposure system comprising a polarization element,
   wherein the polarization element is an optically active polarization element comprising a crystalline quartz plate disposed such that an optical axis of the crystalline quartz plate is substantially parallel to an optical axis of the microlithographic projection exposure system; and
   wherein optical activity of the polarization element changes a polarization of light passing therethrough, such that light incident on an image plane of the microlithographic projection exposure system is substantially tangentially polarized.

11. The optical system of claim 10, wherein a crystal axis of the crystalline quartz plate is substantially normal to a plane of the crystalline quartz plate.

12. The optical system of claim 10, wherein the polarization element rotates a plane of polarization of light passing therethrough by an angle proportional to a thickness of the polarization element.

13. The optical system of claim 10, wherein the microlithographic projection exposure system further comprises a projection lens, and the polarization element is disposed within the projection lens.

14. The optical system of claim 10, wherein the microlithographic projection exposure system further comprises a projection lens, and the polarization element is disposed at a pupillary plane of the projection lens.

15. The optical system of claim 10, wherein the microlithographic projection exposure system further comprises a projection lens, and the polarization element is disposed between a pupillary plane of the projection lens and the image plane of the projection lens.

16. The optical system of claim 15, wherein the polarization element is disposed closer to the image plane of the projection lens than to the pupillary plane of the projection lens.

17. The optical system of claim 16, wherein the polarization element is disposed as close as possible to the image plane of the projection lens.

18. The optical system of claim 10, wherein the polarization element is disposed at a location within the microlithographic projection exposure system where light on the optical beam path propagates substantially parallel to an optical axis of the microlithographic projection exposure system.

19. An optical system comprising:
   a microlithographic projection exposure system comprising a polarization element,
   wherein the polarization element is an optically active polarization element comprising a crystalline quartz plate disposed such that an optical axis of the crystalline quartz plate is substantially parallel to an optical axis of the microlithographic projection exposure system; and
   wherein optical activity of the polarization element, produces at least one of:
   a change in a polarization of light passing therethrough, such that light output from the polarization element is substantially tangentially polarized; and
   a change in a polarization of light passing therethrough, such that light incident on an image plane of the microlithographic projection exposure system is substantially tangentially polarized.

* * * * *

UNITED STATES PATENT AND TRADEMARK OFFICE
CERTIFICATE OF CORRECTION

PATENT NO.        : 7,961,298 B2
APPLICATION NO.   : 12/099533
DATED             : June 14, 2011
INVENTOR(S)       : Michael Gerhard It is certified that error appears in the above-identified patent and that said Letters Patent is hereby corrected as shown below:

Title Page 2; under "OTHER PUBLICATIONS", at Line 5: delete "Microlithogrpahy" and insert -- Microlithography --, therefor Signed and Sealed this
Fourth Day of December, 2012

David J. Kappos
*Director of the United States Patent and Trademark Office*